United States Patent
Hidri et al.

(10) Patent No.: US 7,436,203 B1
(45) Date of Patent: Oct. 14, 2008

(54) ON-CHIP TRANSFORMER ARRANGEMENT

(75) Inventors: Ols Hidri, Munich (DE); Robert Callaghan Taft, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/737,004

(22) Filed: Apr. 18, 2007

(51) Int. Cl.
*H03K 17/16* (2006.01)
(52) U.S. Cl. .......................................... 326/30; 326/26
(58) Field of Classification Search ............... 326/21, 326/22, 26, 27, 30, 82
See application file for complete search history.

(56) References Cited

U.S. PATENT DOCUMENTS

| | | | |
|---|---|---|---|
| 2,470,307 A | | 5/1949 | Guanella |
| 5,255,287 A | * | 10/1993 | Davies et al. ............... 375/287 |
| 5,825,259 A | * | 10/1998 | Harpham .................. 333/22 R |
| 2002/0145485 A1 | * | 10/2002 | Maki et al. ................. 333/22 R |
| 2003/0095036 A1 | * | 5/2003 | Wasaki et al. .......... 340/310.01 |
| 2005/0064840 A1 | * | 3/2005 | Heydari et al. ............... 455/323 |
| 2008/0062600 A1 | * | 3/2008 | Crawley et al. ............... 361/56 |
| 2008/0079496 A1 | * | 4/2008 | Thompson et al. ........... 330/301 |

OTHER PUBLICATIONS

Ken Poulton et al., "A 20GS/s 8b ADC with a 1MB Memory in 0.18 μm CMOS," *IEEE, International Solid-State Circuits Conference*, 2003, 10 pp.
Lee, Thomas H., "Planar Microwave Engineering," *Cambridge University Press*, 2004, pp. 152 and 153.

* cited by examiner

*Primary Examiner*—Don P Le
(74) *Attorney, Agent, or Firm*—Brett A. Hertzberg; Merchant & Gould

(57) ABSTRACT

An integrated circuit requires on-chip termination resistor for minimizing reflections from input signals supplied by an external signal source. The input signal is applied across two bonding pads which serve as input terminals for the integrated circuit. The first bonding pad is coupled to a first on-chip terminating resistor through a first on-chip inductor. The second bonding pad is coupled to a second on-chip terminating resistor though a second on-chip inductor. The two on-chip inductors are arranged in a transformer configuration where the mutual inductance relative to the applied input signal is negative. During operation, the on-chip transformer arrangement effectively shorts common-mode signals to the on-chip terminating resistors and effectively blocks differential-mode signals from the on-chip terminating resistors. Effective bandwidth and common-mode rejection performance is improved with the described on-chip transformer arrangement.

16 Claims, 13 Drawing Sheets

ON-CHIP TRANSFORMER ARRANGEMENT

FIELD OF THE DISCLOSURE

The present disclosure generally relates to integrated circuits that include on-chip termination resistors. More particularly, the present disclosure relates to a transformer arrangement with on-chip termination such that bandwidth and common-mode rejection is improved.

BACKGROUND

Electronic systems can often be implemented in a microelectronic circuit that is typically referred to as an IC or integrated circuit. These electronic systems typically include a number of passive and active electronic components, including but not limited to: resistors, capacitors, inductors, logic gates, linear amplifiers, voltage regulators, signal processors and converters, to name a few.

External signal sources can be coupled to the inputs of integrated circuits to provide the necessary signals utilized within the integrated circuit. The external signal sources can be from any variety of sources including bench test equipment, line drivers, and other integrated circuits, for example. Every signal source includes a characteristic output impedance, while every input to an integrated circuit has a characteristic input impedance. For high frequency circuits, the coupling between the external signal source and the integrated circuit functions as a transmission line whose characteristic impedance is ideally matched to the source impedance of the external signal source. Optimal signal transmission is achieved when the various characteristic impedances of the external signal source, the transmission line, and the integrated circuit are matched to one another. However, mismatches in the relative impedances may result in undesirable signal reflections which can be problematic for the operation of the receiving integrated circuit.

DETAILED DESCRIPTION

Figure 1A:
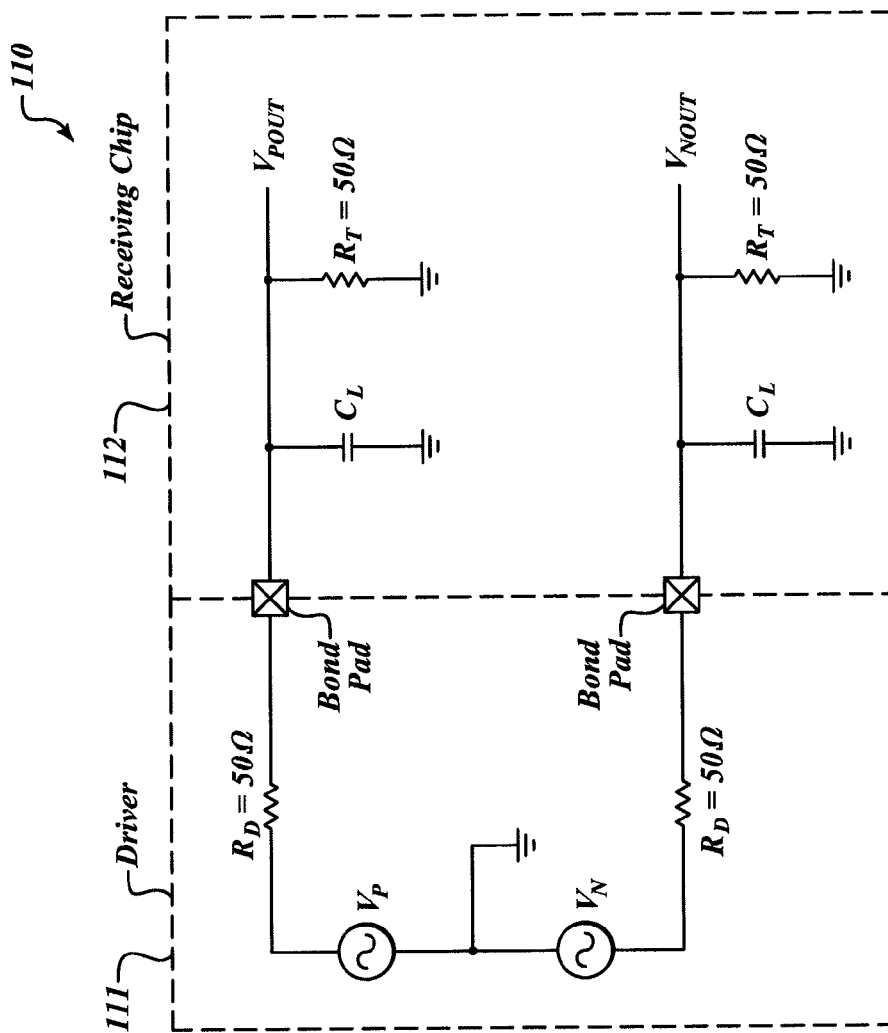
FIGS. 1A-1D are schematic diagrams illustrating various conventional methods to improve common-mode rejection and increased bandwidth rejection.

Various embodiments will be described in detail with reference to the drawings, where like reference numerals represent like parts and assemblies throughout the several views. References to various embodiments do not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electro-magnetic, mechanical, logical, or other connection between the items connected, without any electrical, mechanical, logical or other intermediary items. The term "coupled" can mean a direct connection between items, an indirect connection through one or more intermediaries, or communication between items in a manner that may not constitute a physical connection. The term "circuit" can mean a single component or a plurality of components, active and/or passive, discrete or integrated, that are coupled together to provide a desired function. The term "signal" can mean at least one current, voltage, charge, data or other such identifiable quantity including electrically coupled and magnetically coupled signals.

Briefly stated, the present disclosure generally relates to integrated circuits that require on-chip termination resistor for minimizing reflections from input signals supplied by an external signal source. The input signal is applied via two bonding pads which serve as input terminals for the integrated circuit. The first bonding pad is coupled to a first on-chip terminating resistor through a first on-chip inductor. The second bonding pad is coupled to a second on-chip terminating resistor though a second on-chip inductor. The two on-chip inductors are arranged in a transformer configuration where the mutual inductance relative to the applied input signal is negative. During operation, the on-chip transformer arrangement effectively shorts common-mode signals to the on-chip terminating resistors and effectively blocks differential-mode signals from the on-chip terminating resistors. Effective bandwidth and common-mode rejection performance is improved with the described on-chip transformer arrangement.

The connections between the various external driver circuits and the receiving integrated circuits described herein are illustrated as a simple connection wire. However, the actual coupling between the driver circuits and the receiving circuits is typically represented as a transmission line with a characteristic impedance as previously described. The transmission line can be implemented in any reasonable way including coaxial cable, circuit board traces, strip-line, micro-strip, etc.

Evaluation of Conventional Methods for Identification of the Problem

FIGS. 1A-1D are schematic diagrams illustrating various conventional methods to improve common-mode rejection and increased bandwidth rejection.

FIG. 1A is a schematic diagram of a conventional system (110) that illustrates a characteristic input impedance problem associated with an example conventional integrated circuit. A driver circuit (111) serves as input signal source for an integrated circuit. The driver (111) is coupled to the integrated circuit (i.e., receiving chip 112) through a pair of bond pads. The first input signal (VP) is driven to a first bond pad with characteristic line impedance (RD) of 50 ohms. The second input signal (VN) is driven to a second bond pad with the same characteristic line impedance (RD) of 50 ohms. A parasitic capacitance (CL) from all sources of capacitance is lumped together at the bond pad in the integrated circuit. Each bond pad includes a termination impedance (RT) of 50 ohms as illustrated. The differential input signal received from the bond pads corresponds to VOUT=VPOUT−VNOUT as illustrated.

The bandwidth associated with FIG. 1A is bandwidth limited as a consequence of parasitic capacitance CL. The input impedance of receiving chip 112 is determined by the parallel combination of RT and CL, while the output impedance of driver 111 is determined by resistor RD. The amplitude of the voltage VOUT is determined by the ratio of resistor RD over the input impedance RT∥CL. The bigger the ratio, the smaller the amplitude of VOUT for a fixed VIN and vice-versa. The parasitic capacitance (CL) has a characteristic impedance (ZC) that is inversely proportional to frequency (ZC=1/sC, where s=j*2*pi*frequency, and where C=capacitance of capacitor CL). As the frequency of the input signal (VIN) increases in value, the impedance of capacitor CL decreases, a corresponding increase in conductivity such that the output signals (VOUT) are effectively shunted to ground. The overall effect is that the available bandwidth for receiving chip 112 is limited by the parasitic capacitance (CL).

Figure 1B:
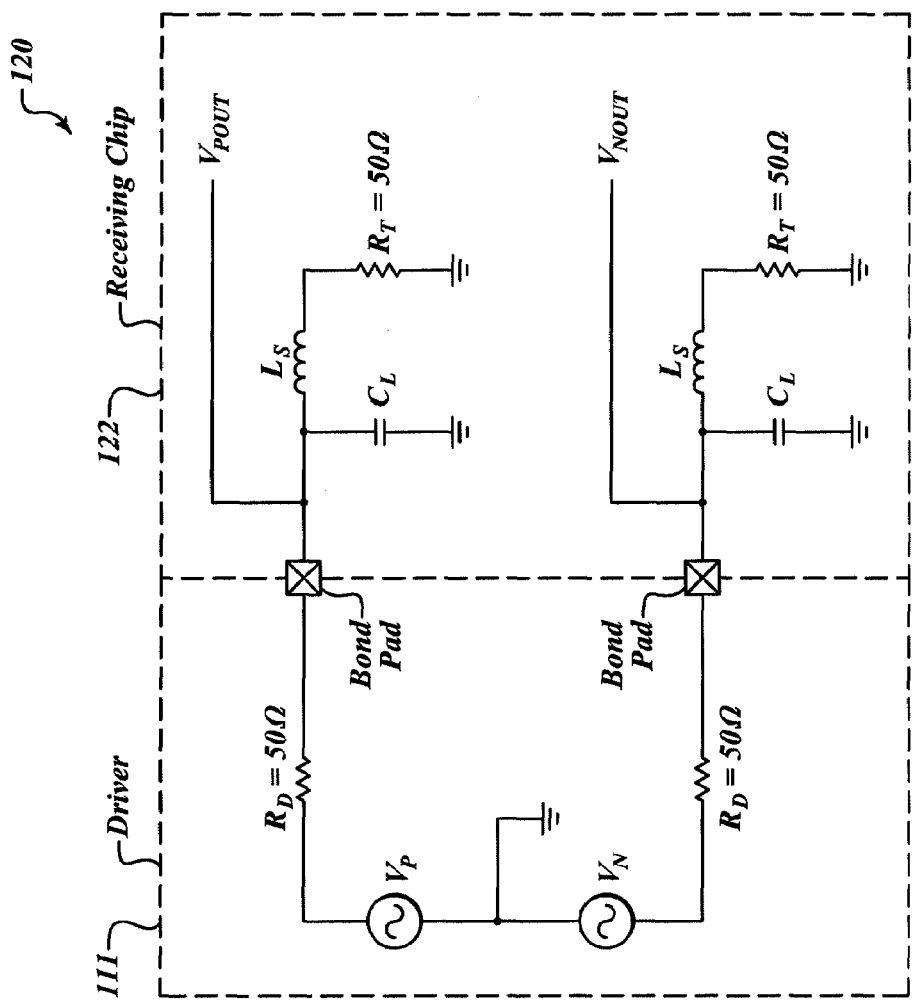

FIG. 1B is a schematic diagram of a conventional system (120) that illustrates a method for improving bandwidth in an example integrated circuit. The driver circuit (111) is identical to that described previously with respect to FIG. 1A. The receiving chip (112) from FIG. 1A has been modified by including an inductor (LS) in series between each bond pad and its respective terminating resistor RT as illustrated by receiving chip 122. The parasitic capacitance is again illustrated as lumped capacitance (CL) in parallel with the terminating resistor (RT).

Although the bandwidth associated with FIG. 1B is still bandwidth limited as a consequence of parasitic capacitance CL, series coupled inductor LS is arranged to increase the signal bandwidth. Each series inductor (LS) has a characteristic impedance (ZL) that is proportional to frequency (ZL=sL, where s=j*2*pi*frequency, and where L=inductance of inductor LS). For low frequencies, series inductor LS has a very low impedance that in the limit of DC conditions approaches a short circuit, while for high frequencies series inductor LS approaches an open circuit condition. The increasing impedance of series inductor LS counteracts the increase in conductivity of capacitor CL so that the input impedance of the receiving chip (122) does not decrease as quickly with increasing frequency. As a result of the series inductor, the voltages VPOUT and VNOUT, hence also the differential voltage on chip VOUT=VPOUT−VNOUT, does not decrease in magnitude as quickly for increasing value of frequency such that the bandwidth is increased.

Figure 1C:
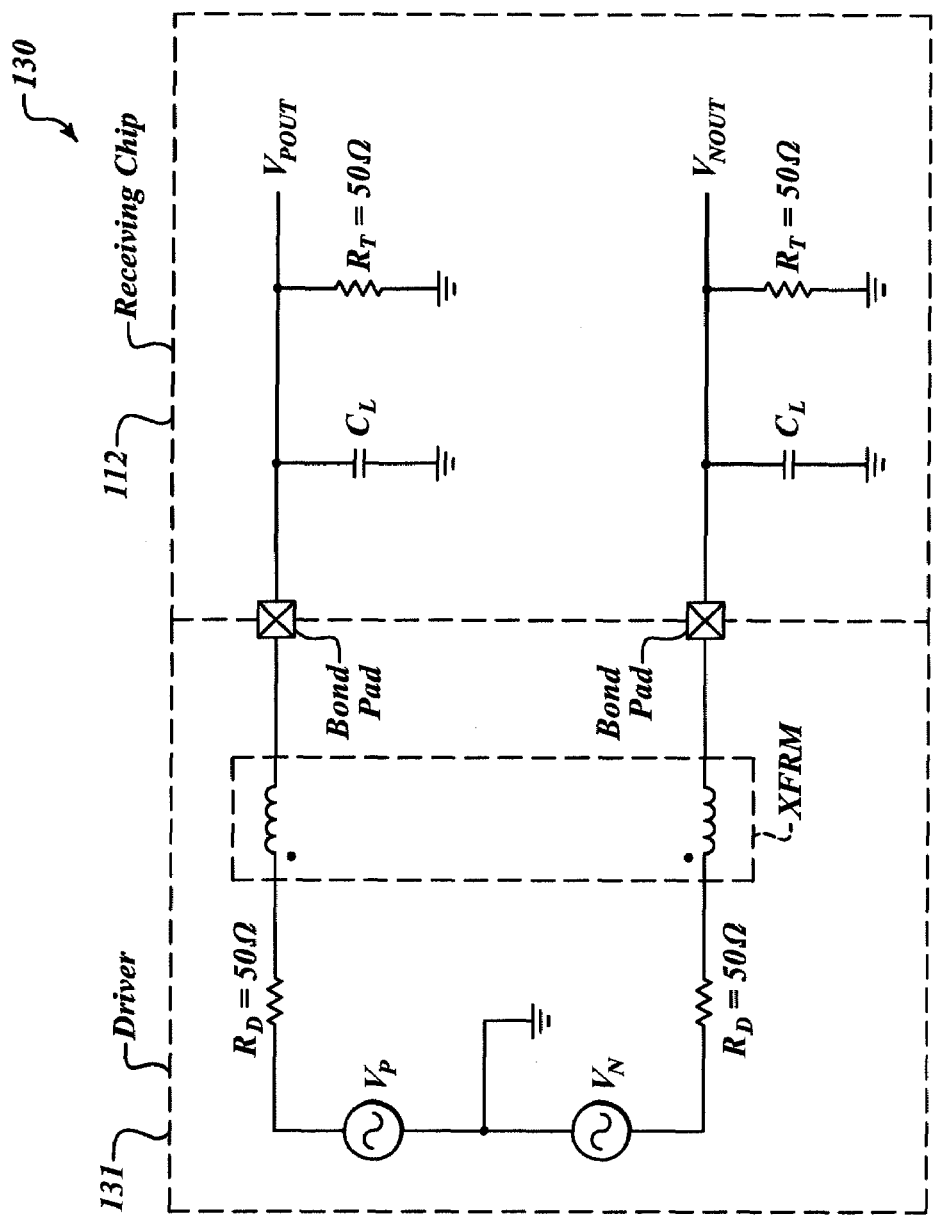

FIG. 1C is a schematic diagram of a conventional system (130) that illustrates a method for improving common-mode rejection in an example integrated circuit. The receiving chip (112) is identical to that described previously with respect to FIG. 1A. The driver circuit (111) from FIG. 1A has been modified by including an off-chip transformer (XFRM) in series between each driver circuit and the respective bond pad for integrated circuit 122 as illustrated by driver 131. The transformer (XFRM) is sometimes referred to as a common-mode choke or a balun in this configuration.

The pair of driving source voltages (VP, VN) can be characterized by a common mode portion (VCM), which is usually referenced to the system ground, and a differential portion (VDIFF/2) and can be expressed as follows: VP=VCM+VDIFF/2 and VN=VCM−VDIFF/2. The presence of the off-chip transformer (XFRM) acts a choke that blocks the common-mode portion of the signals (VCM) from the bond pads, and passes the differential portion of the signals (VDIFF) to the bond pads of the receiving chip (112).

Figure 1D:
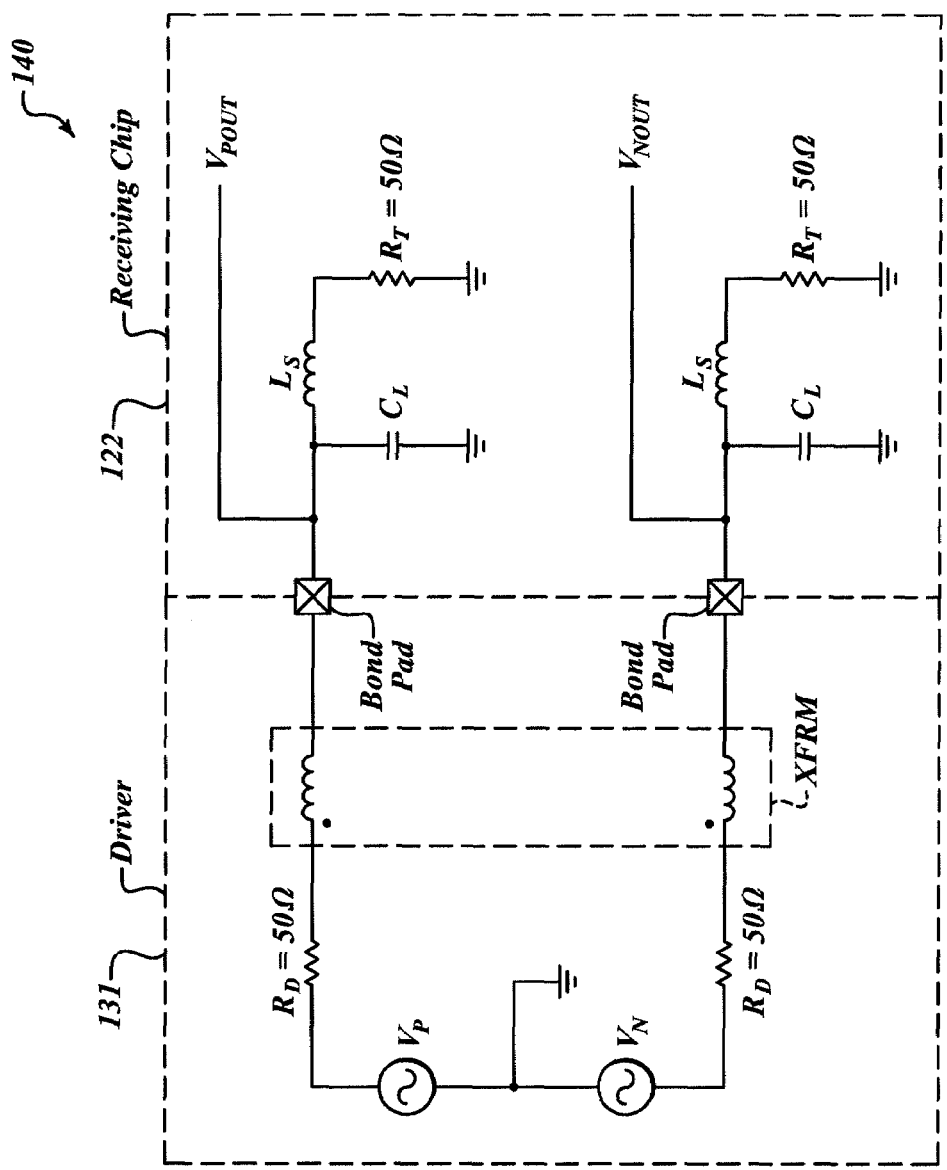

FIG. 1D is a schematic diagram of a conventional system (140) that illustrates a method for improving common-mode rejection and signal bandwidth in an example integrated circuit. The driver circuit (131) is identical to that described previously with respect to FIG. 1C, while the receiving chip (122) is identical to that described previously with respect to FIG. 1B. The driver circuit (131) thus includes the benefits of common-mode blocking from the off-chip transformer, while the receiving chip (122) includes the benefits of enhanced signal bandwidth from the on-chip inductors.

The present disclosure has contemplated numerous varieties of conventional methods to increase bandwidth and improve common-mode rejection such as those explored above. The present invention provides an elegant solution to improve common-mode rejection with an on-chip transformer arrangement that eliminates the need for an external off-chip transformer and simultaneously provides for increased signal bandwidth without any additional components. The described circuit arrangement of the present invention can be applied to high performance analog-to-digital converter circuits, where an analog differential input signal is mandatory, or any other high frequency circuit application where on-chip termination is necessary for an input signal.

On-Chip Transformer Arrangement

Although the example circuits described herein utilize a 50 ohm characteristic impedance for various driving and terminating impedances (e.g., RD, RT, etc.), a higher or lower impedance is equally applicable and within the scope of this disclosure. For example, in high frequency applications a lower impedance may be desired to improve signal bandwidth. The termination impedance (e.g. RT), which is matched to the driving impedance (e.g., RD), can have any appropriate value as may be required in a particular high-frequency application (e.g., 25 Ohms, 50 Ohms, 75 Ohms, 100 Ohms, etc.).

Figure 2:
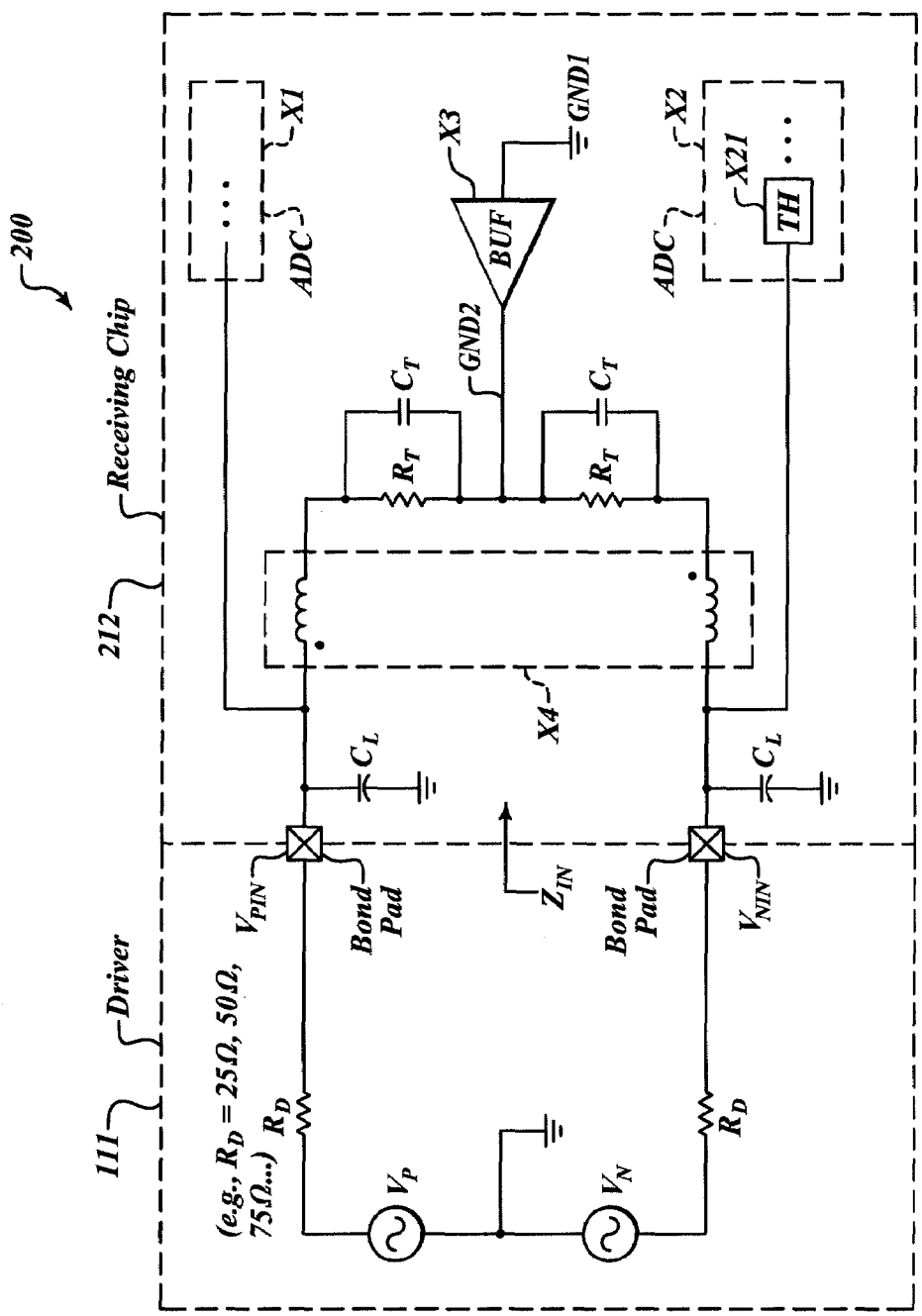
FIG. 2 is a schematic diagram illustrating an on-chip transformer arrangement to improve common-mode rejection and increase bandwidth rejection in accordance with the present disclosure.

FIG. 2 is a schematic diagram (200) illustrating an on-chip transformer arrangement to improve common-mode rejection and increase bandwidth rejection in accordance with the present disclosure. The driver circuit (111) is identical to that described previously with respect to FIG. 1A. The receiving chip (212) is similar to receiving chip 112 from FIG. 1A, but with the addition of a specially configured on-chip transformer (X4). Each bond pad is coupled to terminating impedance (RT) through a respective winding of the on-chip transformer. The terminating impedances share a common node that corresponds to a common ground reference voltage (GND2). The common ground reference voltage (GND2) can be provided by a simple ground terminal, or by a buffer (X3) that is arranged to provide the common ground reference from any appropriate voltage reference (e.g., GND1, VDD, VSS, [VDD−VSS]/2, VREF, etc.).

The configuration of the on-chip transformer (X4) is distinct and different from the prior implementations. Unlike the on-chip inductors previously described, on-chip transformer X4 has a negative mutual inductance characteristic relative to the input terminals of the on-chip transformer. The first inductive winding is coupled to the bond pad that corresponds to input signal VPIN, while the second inductive winding is coupled to the bond pad that corresponds to the input signal VNIN. The mutual inductance characteristic of the inductive windings in the on-chip transformer (X4) is designated by registrations dots. The first inductive winding (L1) has a registration dot on the bond pad side, while the second inductive winding (L2) has a registration dot on the terminating impedance (RT) side. Opposite to prior art implementations, the magnetic fields created when an input signal is applied to the input sides of the on-chip transformer (X4) result in induced currents that flow in the same general direction from the input side to the terminating impedance side. This arrangement will be further discussed below with respect to FIGS. 4A-4C and 5A-5C.

In some implementations, the receiving chip (212) includes an analog-to-digital converter (ADC) functionality for sensing the differential input signal at the bond pads. An example ADC circuit can be partitioned into two functional partitions, one functional partition (X1) for monitoring the signal VPIN and one for functional partition (X2) for monitoring the signal VNIN. Each functional partition can include a track and hold circuit (TH) such as is illustrated by track and hold circuit X21 illustrated in FIG. 2. The output of each track and hold circuit is used to provide a sampled signal for use by additional circuits in the analog-to-digital conversion process. The functional partitions described herein can be implemented as physically separate circuits, or combined into a single physical circuit as may be desired.

Optional capacitors (CT) can be coupled to the terminating impedances (RT) to reduce additional bandwidth associated with the common-mode signals. The optional capacitors (CT) can either be coupled in parallel with the terminating impedances as shown in FIG. 2, or their common connection at GND2 can be coupled to some other circuit ground or reference voltage.

On-Chip Transformer Arrangement Frequency Response

Figure 3A:
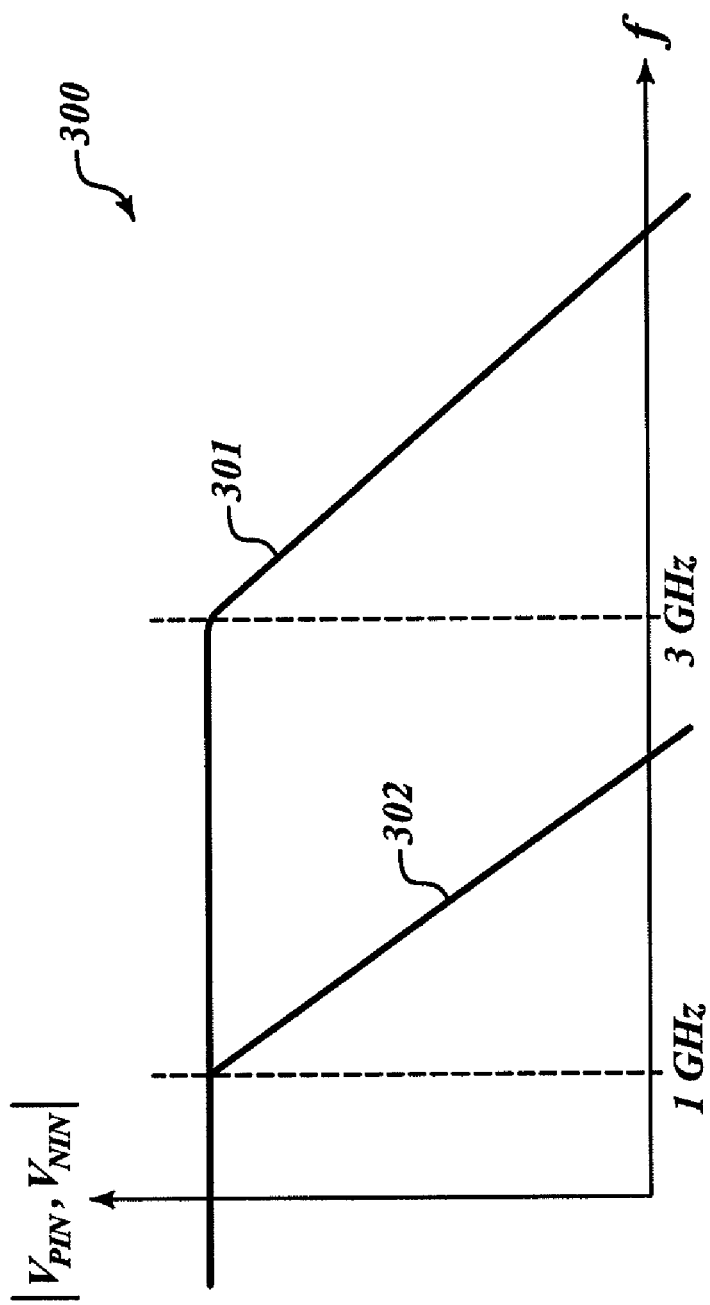
FIGS. 3A and 3B are frequency response graphs illustrating bandwidth improvements achieved in an example on-chip transformer configured for operation according to the present disclosure.
Figure 3B:
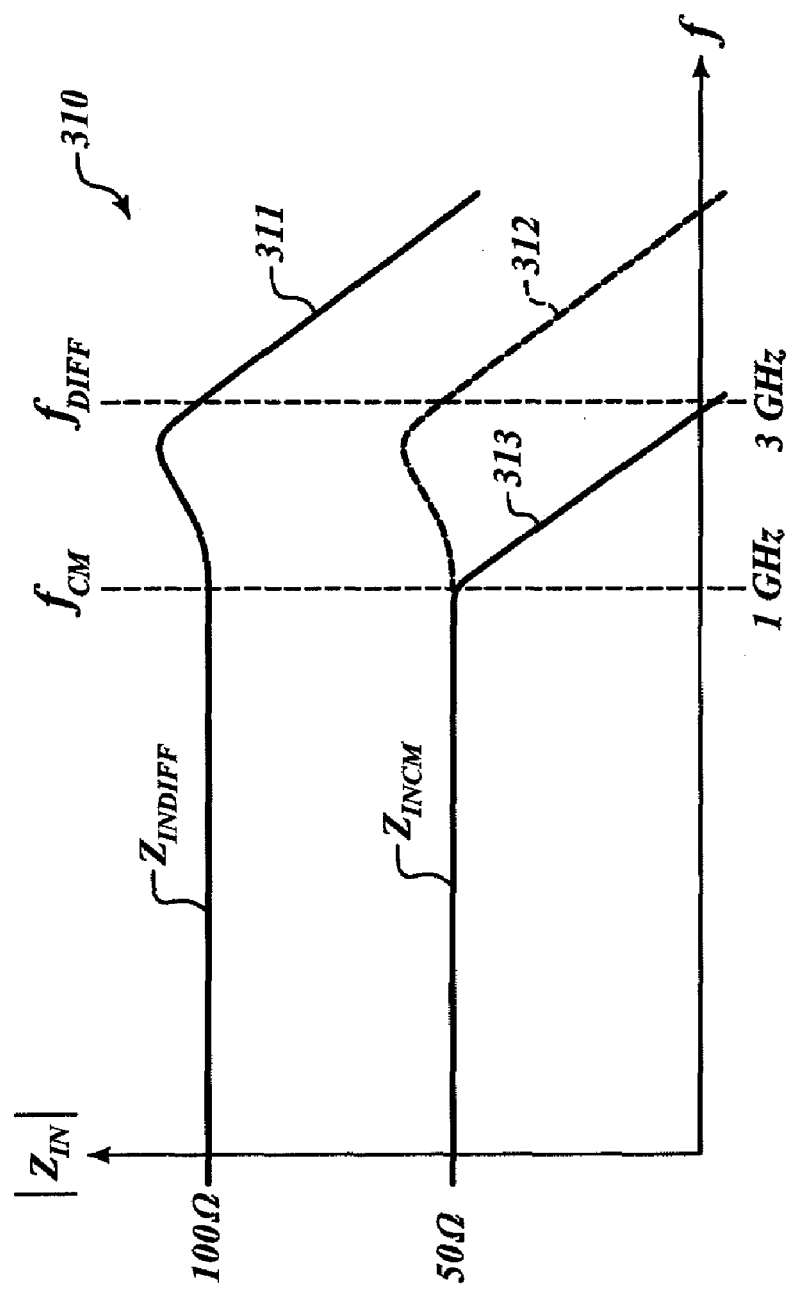

FIGS. 3A and 3B are frequency response graphs illustrating bandwidth improvements achieved in an example on-chip transformer configured for operation according to the present disclosure as illustrated by FIG. 2. The differential input signal (VIN) provided from the input source driver (112) is again described as VIN(t)=VP(t)−VN(t), where VP(t)=VCM(t)+VDIFF(t)/2 and VN(t)=VCM(t)−VDIFF(t)/2. The common mode portion of the input signal corresponds to VCM(t), while the differential mode portion of the input signal corresponds to VDIFF(t).

As illustrated by FIG. 3A, a first set of graphs (300) includes two waveforms (301, 302). The first waveform (301) demonstrates the magnitude of the frequency response for a differential-mode signal sensed at the VPIN bond pad, while the second waveform (302) demonstrates the frequency response of a common-mode signal sensed at the VPIN bond pad. Signal 301 has a −3 dB corner frequency of 3 GHz, while signal 302 has a −3 dB corner frequency of 1 GHz. The difference in frequency response of the differential-mode and common-mode signals is due to the specific arrangement of the on-chip transformer. The illustrated corner frequencies are examples and are not intended to limit the scope of this disclosure. The overall frequency response is dependent upon the parasitic capacitance (CL) and the specific inductance values associated with the on-chip transformer.

FIG. 3B is a second set of graphs (310) including three waveforms (311, 312, 313) illustrating the input impedance (ZIN) of the receiving chip (212) from FIG. 2. The input impedance (ZIN) can be evaluated using superposition to identify the differential mode portion (ZINDIFF) and the common-mode portion (ZINCM). For the example receiving chip (212) of FIG. 2, ZINDIFF has a nominal value of 2*RT or 100 Ohms as shown by waveform 311, and ZINCM has a nominal value of 1*RT or 50 Ohms as shown by waveforms 312 and 313. The input impedance (ZIN) is a frequency dependent quantity that is affected parasitic capacitance (CL) and the specific inductance values of the on-chip transformer. Example parasitic capacitances are in the range of 0.1 pF-1.5 pF. ZINDIFF has a −3 dB corner frequency in an example range of 0.1 GHz to 50 GHz with an example value illustrated as 3 GHz in FIG. 3B. ZINCM has a −3 dB corner frequency in an example range of 50 MHz to 20 GHz with an example value illustrated as 1 GHz in FIG. 3B via waveform 313. Without the use of the on-chip transformer with mutual coupling, ZINCM has the same frequency response as waveform 311 as illustrated by waveform 312.

The common-mode rejection ratio (CMRR) is one figure of merit for the receiving chip. As the input signal increases in frequency, the on-chip transformer arrangement will attenuate the common-mode signals at a lower frequency than the prior art implementations that include an on-chip inductor. The −3 dB point in the frequency response is evaluated to examine common-mode rejection. The CMRR of a receiving chip is determined by the ratio of the differential-mode input impedance to the common-mode input impedance. The mathematical equation for the CMRR is give as: CMRR=20*log (ZINDIFF/ZINCM).

On-Chip Transformer Arrangement Equivalent Circuits

Figure 4A:
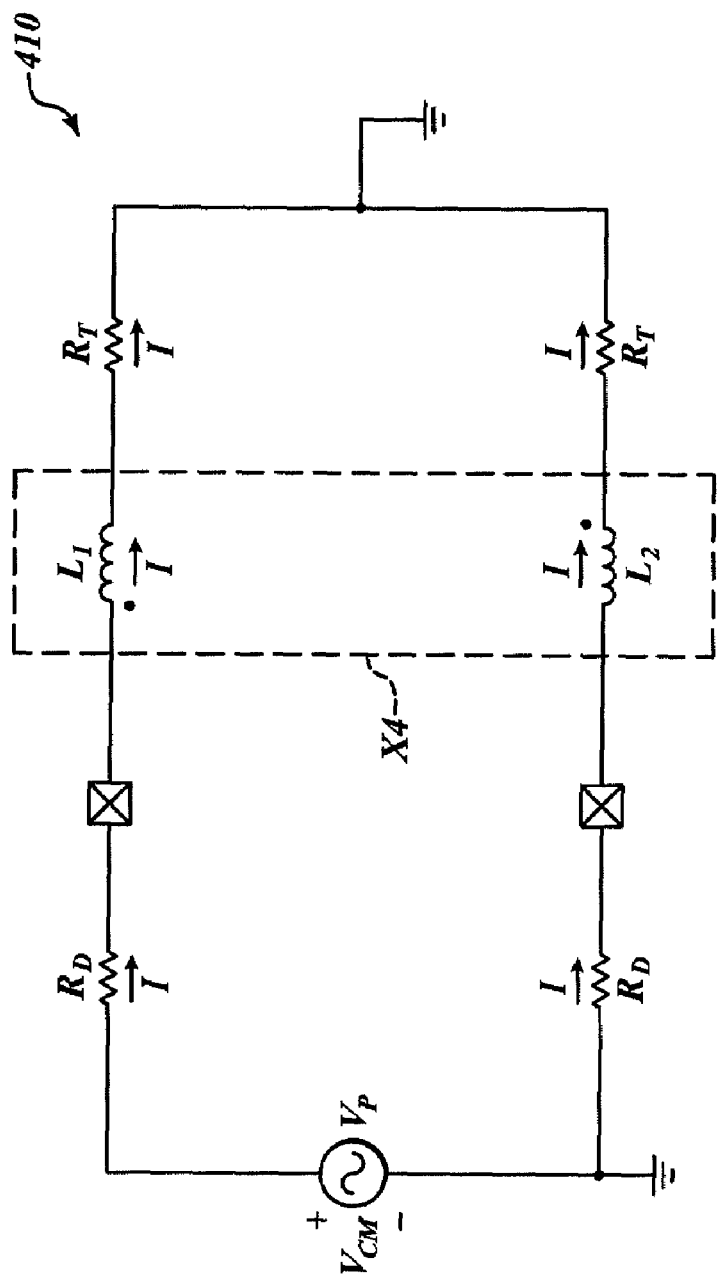
FIGS. 4A-4C are schematic diagrams detailing the equivalent circuits for a common-mode input signal in an example on-chip transformer configured for operation according to the present disclosure.
Figure 4B:
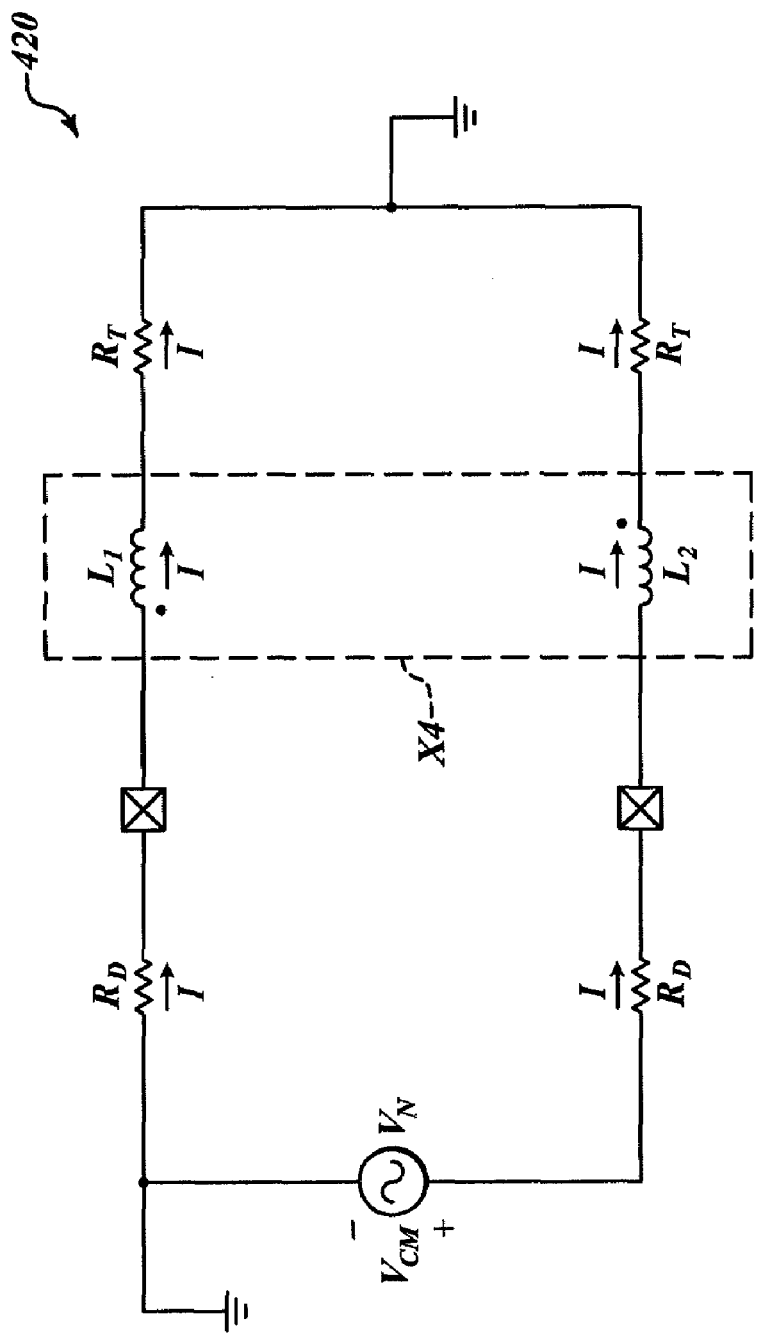
Figure 4C:
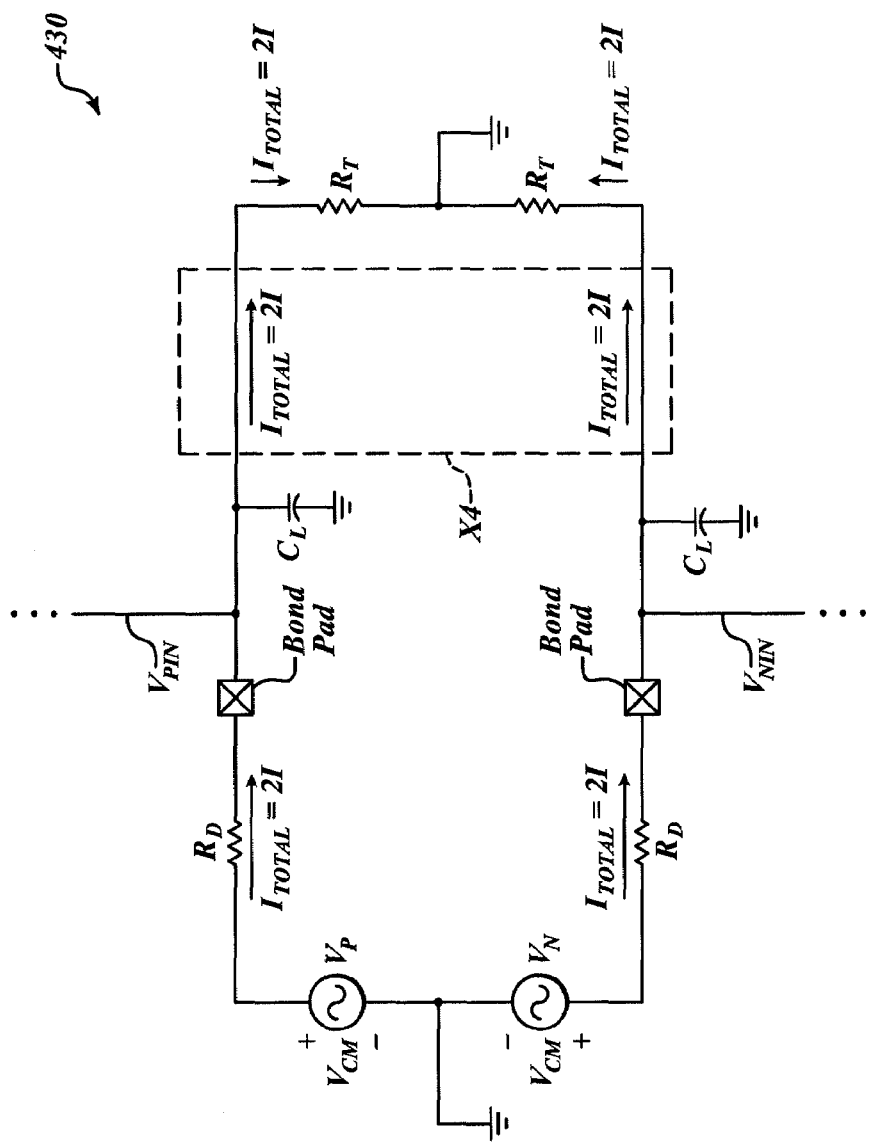

FIGS. 4A-4C are schematic diagrams detailing the equivalent circuits for a common-mode input signal in an example on-chip transformer configured for operation according to the present disclosure.

FIG. 4A is a schematic diagram (410) illustrating the condition for FIG. 2 wherein signal source VP corresponds to a common-mode signal (VCM), and where signal source VN is eliminated by setting VN=0V. Signal VCM is coupled to the first bond pad of the receiving chip through a first driving impedance (RD), while ground is coupled to the second bond pad of the receiving chip through a second driving impedance (RD). The first terminating resistance (RT) of the receiving chip is coupled to the first bond pad through a first inductor (L1), while the second terminating resistance (RT) of the receiving chip is coupled to the second bond pad through a second inductor (L2) associated with a transformer (X4). The bond pad side of the first inductor (L1) includes an inductor orientation marker or dot, while the terminating resistor side of the second inductor (L2) includes another inductor orientation marker.

The polarity dots on the transformer (X4) denote the relationship of the inductors (L1, L2) and their magnetic coupling or mutual inductance characteristic. Current (I) flows from the driving source through the first inductor (L1) of the on-chip transformer (X4) as illustrated. As current flows through the winding of the first inductor (L1), a magnetic field is created that induces current into the second inductor (L2) as a result of the magnetic coupling characteristics or mutual inductance of the on-chip transformer (X4). Assuming that the windings in the on-chip transformer (X4) have a one-to-one relationship, the first inductor (L1) induces an equal magnitude current in the second inductor (L2) and vice-versa. The direction of the current induced is determined by the relationship of the inductive windings in the on-chip transformer (X4), and is identifiable by polarity marks or dots on the transformer windings. As shown in the Figures, the transformer winding corresponding to inductor L1 has a polarity dot on the side coupled to the bond pad, while the transformer winding corresponding to inductor L2 has a polarity dot on the side coupled to the terminating resistor (RT). For a current flowing from the bond pad into inductor L1, the side with the registration dot on inductor L1, an equal current (I) flows out of inductor L2 into terminating resistor RT, the side with the registration dot on inductor L2.

The driving source impedance (RD) is ideally matched to the terminating resistors (RT1, RT2) so that reflections are minimized. When the driving and terminating resistors are matched to one another (RD=RT=R) the corresponding current (I) is given as: I=VCM/4R, where the currents in the first inductor (L1) and the second inductor (L2) are matched to one-another for a 1:1 winding ratio (assuming 100% efficiency in the transformer).

FIG. 4B is a schematic diagram (420) illustrating the condition for FIG. 2 wherein signal source VN corresponds to a common-mode signal (VCM), and where signal source VP is eliminated by setting VP=0V. Signal VCM is coupled to the second bond pad of the receiving chip through the second driving impedance (RD), while ground is coupled to the first bond pad of the receiving chip through the second driving impedance (RD). As current flows through the winding of the second inductor (L2), a magnetic field is again created that induces current into the first inductor (L1) as a result of the magnetic coupling characteristics of the on-chip transformer (X4). The currents flowing in the windings are again given as I=VCM/4R.

FIG. 4C is a schematic diagram (430) illustrating the combined effects of FIG. 4A and FIG. 4B. As current flows through the two windings (L1, L2) a magnetic field is created that induces currents into the opposite inductors as a result of the magnetic coupling characteristics of the on-chip transformer (X4). The total current in each terminating resistor (RT) is given as: ITOTAL=2I=2(VCM/4R)=VCM/2R. The transformer (X4) acts as a short circuit in this configuration with respect to the common-mode signal. As is desired, the transformer (X4) does not add any additional bandwidth for the common-mode signal. Additional attenuation can be achieved by adding a capacitor in parallel with each of the terminating resistors (RT).

Figure 5A:
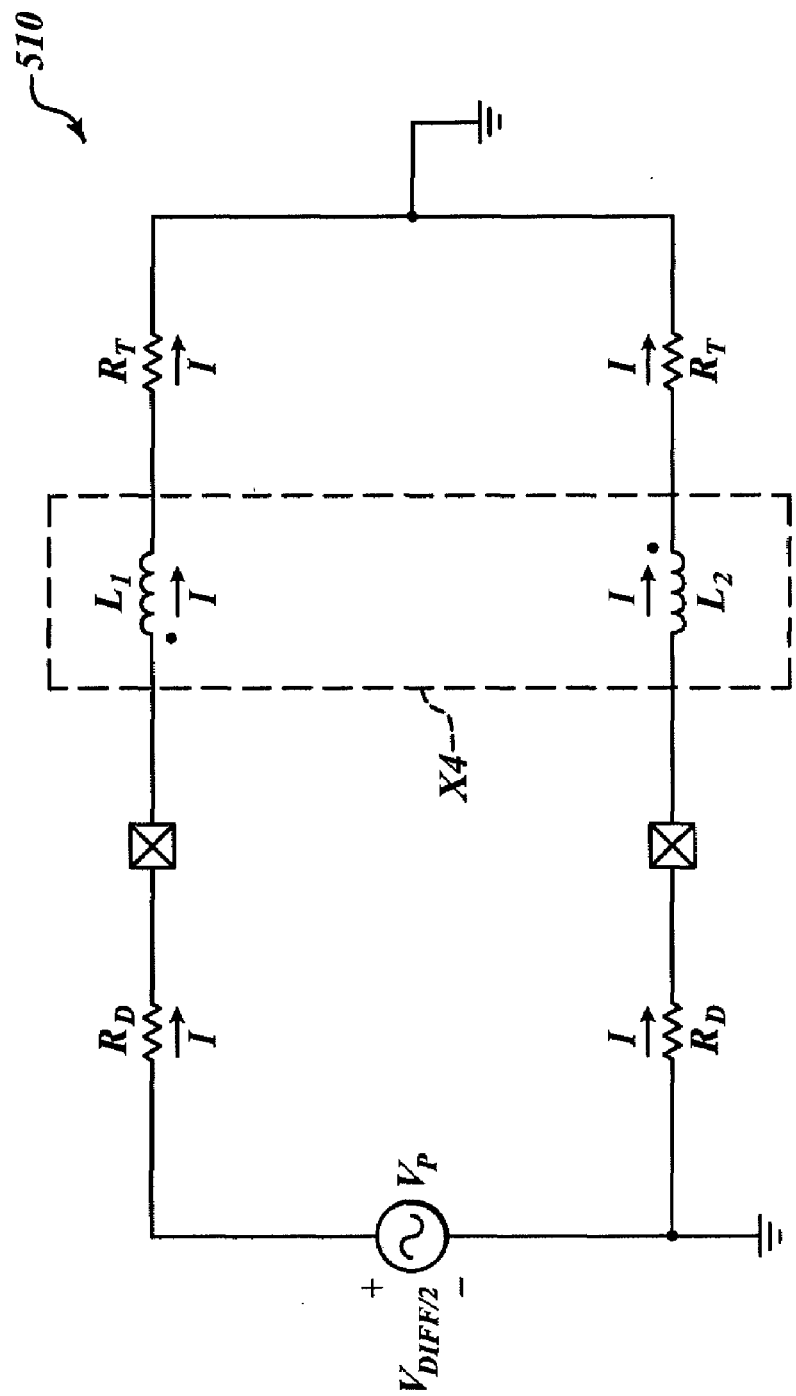
FIGS. 5A-5C are schematic diagrams detailing the equivalent circuits for a differential input signal in an example on-chip transformer configured for operation according to the present disclosure.
Figure 5B:
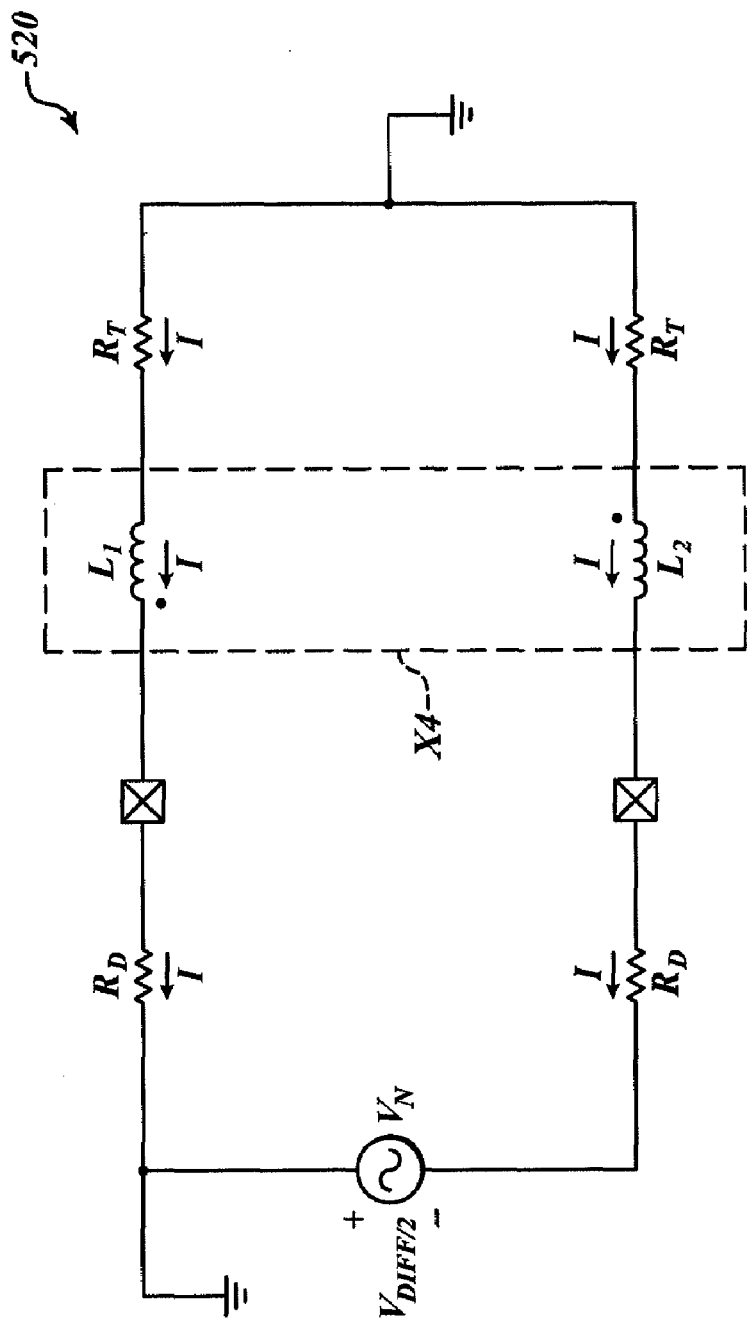
Figure 5C:
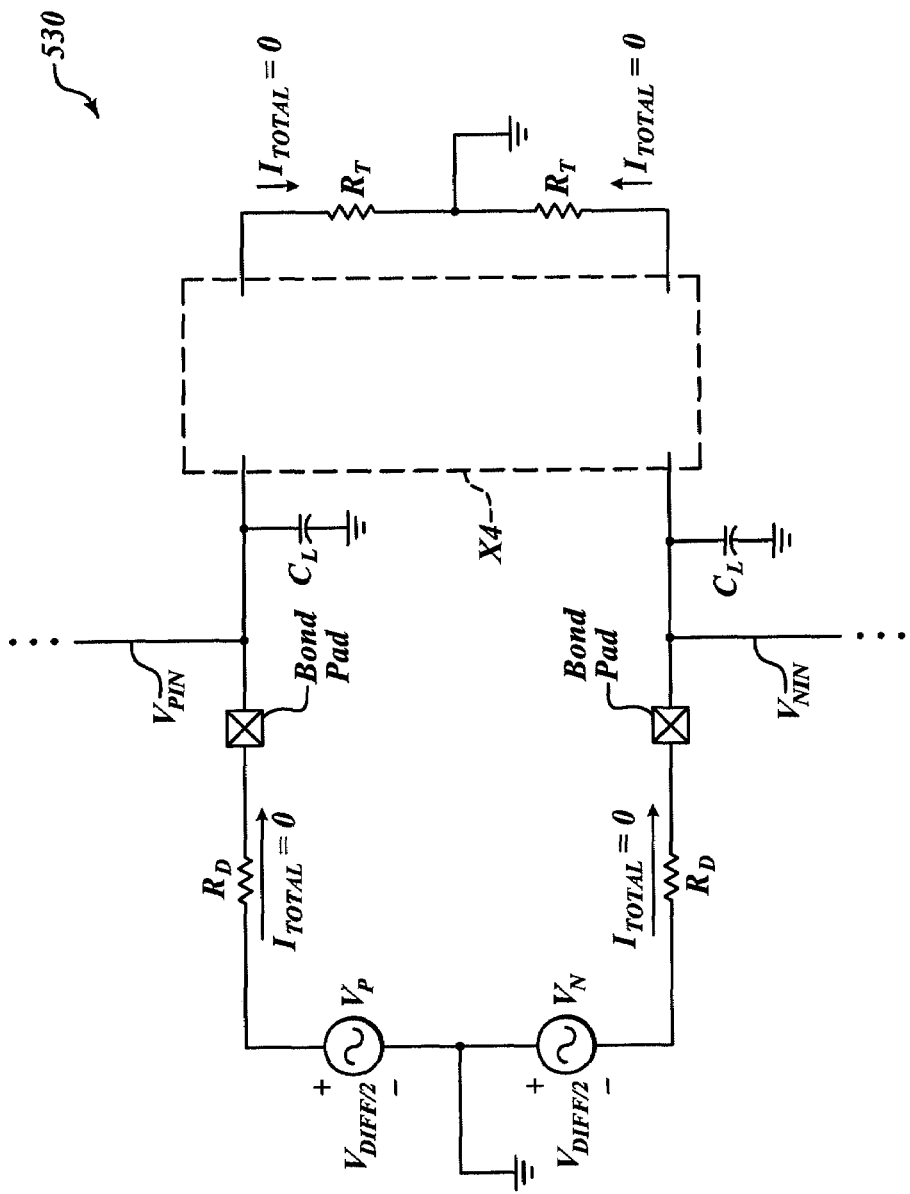

FIGS. 5A-5C are schematic diagrams detailing the equivalent circuits for a differential-mode input signal in an example on-chip transformer configured for operation according to the present disclosure.

FIG. 5A is a schematic diagram (510) illustrating the condition for FIG. 2 wherein signal source VP corresponds to a differential-mode signal (VDIFF/2), and where signal source VN is eliminated by setting VN=0V. Signal VP is coupled to the first bond pad of the receiving chip through the first driving impedance (RD), while ground is coupled to the second bond pad of the receiving chip through the second driving impedance (RD). As current (I) flows through inductor L1 into terminating resistor RT, an equal current (assuming 100% efficiency) induced into inductor L2 by the transformer arrangement flows into terminating resistor RT, where the current (I) is determined as: I=(VDIFF/2)/4R=VDIFF/8R.

FIG. 5B is a schematic diagram (520) illustrating the condition for FIG. 2 wherein signal source VN corresponds to a differential-mode signal (-VDIFF/2), and where signal source VP is eliminated by setting VP=0V. Signal VN is coupled to the second bond pad of the receiving chip through the second driving impedance (RD), while ground is coupled to the first bond pad of the receiving chip through the first driving impedance (RD). As current (I) flows through inductor L2 into the second source driving impedance (RD), an equal current (assuming 100% efficiency) induced into inductor L1 by the transformer arrangement flows into source driving impedance RD, where the current (I) is determined as: I=(-VDIFF/2)/4R=-VDIFF/8R.

FIG. 5C is a schematic diagram (530) illustrating the combined effects of FIG. 5A and FIG. 5B. As current flows through the two windings (L1, L2) a magnetic field is created that induces currents into the opposite inductors as a result of the magnetic coupling characteristics of the on-chip transformer (X4). Since the signals for VP and VN in the differential mode are related to one another by a sign reversal or a 180 degree phase change. The total current in each terminating resistor (RT) is given as: ITOTAL=VDIFF/8R+(-VDIFF/8R)=0. The transformer (X4) acts as an open circuit in this configuration with respect to the differential-mode signal. As is desired, the transformer (X4) adds additional bandwidth for the differential-mode signal.

The present disclosure provides an elegant solution not found in prior implementations so that two functions are accomplished with a single circuit arrangement. Common-mode rejection is improved with the described an on-chip transformer arrangement so that a previously required external off-chip transformer is eliminated. The same circuit arrangement also provides for increased signal bandwidth without any additional components. The simultaneous operation of increased signal bandwidth and improved common-mode rejection is thus accomplished with an elegant solution that minimizes components.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An integrated circuit arrangement that is arranged to receive an input signal, wherein the input signal includes a common-mode portion and a differential-mode portion, the integrated circuit comprising:
   a first bond pad that is coupled to a first port of the integrated circuit;
   a second bond pad that is coupled to a second port of the integrated circuit, wherein the first port and the second port are arranged to receive the input signal;
   a first terminating impedance that is coupled between a first node and a common node;
   a second terminating impedance that is coupled between a second node and the common node, wherein the common node is arranged as a ground reference potential;
   an on-chip transformer arrangement that includes a first inductor that is coupled between the first bond pad and the first node and a second inductor that is coupled between the second bond pad and the second node, wherein the first inductor is mutually inductively coupled to the second inductor, wherein the on-chip transformer is arranged such that common-mode portions of the input signal are effectively shorted through the first and second inductors to the ground reference potential via the first and second terminating impedances, and wherein the on-chip transformer is further arranged such that differential-mode portions of the input signal are effectively blocked from the first and second terminating resistors.

2. The integrated circuit of claim 1, further comprising a buffer circuit that includes an output port that is coupled to the common node such that the ground reference potential is buffered.

3. The integrated circuit of claim 2, wherein the ground reference potential corresponds to one of: zero volts, VDD, VSS, (VDD-VSS)/2, and a reference voltage.

4. The integrated circuit of claim 1, further comprising a track and hold amplifier circuit, wherein the first bond pad and the second bond pad are coupled to the track and hold amplifier circuit such that the differential-mode portion of the input signal is sampled by the track and hold amplifier circuit.

5. The integrated circuit of claim 1, further comprising a first track and hold amplifier circuit that is coupled to the first bond pad for receiving a first portion of the input signal, and a second track and hold amplifier circuit that is coupled to the second bond pad for receiving a second portion of the input signal.

6. The integrated circuit of claim 1, further comprising an analog-to-digital converter that is coupled to the first bond pad and the second bond pad, wherein the analog-to-digital converter circuit is arranged to convert the differential-mode portion of the input signal to a digital value.

7. The integrated circuit of claim 1, further comprising a first analog-to-digital converter that is coupled to the first bond pad, and a second analog-to-digital converter that is coupled to the second bond pad, wherein the first and second analog-to-digital converters are arranged to convert the input signal to a digital value.

8. The integrated circuit of claim 1, further comprising a first capacitor that is arranged in parallel with the first terminating impedance and a second capacitor that is arranged in parallel with the second terminating impedance.

9. The integrated circuit of claim 1, wherein the first inductor and the second inductor are arranged for mutual inductance via a substantially concentric inductor layout.

10. The integrated circuit of claim 9, wherein the concentric inductor layout is physically arranged in one of: a circular arrangement, an elliptical arrangement, a square arrangement, a pentagonal arrangement, a hexagonal arrangement, a septagonal arrangement, an octagonal arrangement, or an n-sided arrangement, where a winding for the first inductor is adjacent another winding for the second inductor for mutually inductive transformer coupling.

11. A method for an integrated circuit to receive a input signal from an external source, wherein the input signal includes a common-mode portion and a differential-mode portion, the method comprising:
receiving a first portion of the input signal at a first bond pad of the integrated circuit;
receiving a second portion of the input signal at a second bond pad of the integrated circuit;
coupling a first common-mode portion of the input signal from the first bond pad to a first terminating impedance via a first inductive winding in an on-chip transformer within the integrated circuit;
coupling a second common-mode portion of the input signal from the second bond pad to a second terminating impedance via a second inductive winding in the on-chip transformer within the integrated circuit;
blocking a first differential-mode portion of the input signal from the first terminating impedance with the first inductive winding in the on-chip transformer;
blocking a second differential-mode portion of the input signal from the second terminating impedance with the second inductive winding in the on-chip transformer; and
magnetically coupling the first inductive winding to the second inductive winding in the on-chip transformer, wherein the bandwidth and common-mode rejection of the integrated circuit are simultaneously improved by the on-chip transformer.

12. The method of claim 10, further comprising: reducing the bandwidth of the first common-mode portion of the input signal via a first capacitor that is coupled in parallel with the first terminating impedance, and reducing the bandwidth of the second common-mode portion of the input signal via a second capacitor that is coupled in parallel with the second terminating impedance.

13. The method of claim 10, further comprising: sensing the differential-mode portions of the input signal at the first and second bond pads.

14. The method of claim 12, further comprising converting the sensed differential-mode portions of the input signal to a digital quantity.

15. The method of claim 10, further comprising generating a buffered ground reference for the first and second terminating impedances with a buffer circuit.

16. An apparatus in an integrated circuit for simultaneously enhancing the signal bandwidth and common-mode rejection associated with an input signal that is received by the integrated circuit, the apparatus comprising:
a first bond pad of the integrated circuit that is arranged for receiving a first portion of the input signal;
a second bond pad of the integrated circuit that is arranged for receiving a second portion of the input signal;
a first terminating impedance;
a second terminating impedance; and
an on-chip transformer comprising a first inductive winding and a second inductive winding that are inductively coupled to one another for mutual inductance, wherein the wherein the first inductive winding is coupled between the first bond pad and the first terminating impedance, wherein the second inductive winding is coupled between the second bond pad and the second terminating impedance, wherein the first inductive winding is inductively coupled to the second inductive winding for mutual inductance, and wherein the on-chip transformer has a first polarity dot associated with a junction of the first inductive winding corresponding and the first bond pad, and wherein the on-chip transformer has a second polarity dot associated with a junction of the second inductive winding to the second terminating resistor.

* * * * *

UNITED STATES PATENT AND TRADEMARK OFFICE
CERTIFICATE OF CORRECTION

PATENT NO. : 7,436,203 B1
APPLICATION NO. : 11/737004
DATED : October 14, 2008
INVENTOR(S) : Ols Hidri et al.

It is certified that error appears in the above-identified patent and that said Letters Patent is hereby corrected as shown below:

Column 6, Line 20: "CMRR is give" should read --CMRR is given--

Column 10, Line 39: "the wherein the first inductive" should read --the first inductive--

Signed and Sealed this

Seventeenth Day of March, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,436,203 B1 | |
| APPLICATION NO. | : 11/737004 | |
| DATED | : October 14, 2008 | |
| INVENTOR(S) | : Ols Hidri and Robert C. Taft | |

It is certified that error appears in the above-identified patent and that said Letters Patent is hereby corrected as shown below:

Column 8, line 28, claim 1, replace "An integrated circuit arrangement" with --An integrated circuit--;
Column 8, line 42, claim 1, replace "an on-chip transformer arrangement" with --an on-chip transformer--;
Column 8, lines 54-55, claim 1, replace "the first and second terminating resistors" with --the first and second terminating impedances--;
Column 9, lines 7-8, claim 6, replace "an analog-to-digital converter" with --an analog-to-digital converter circuit--;
Column 9, line 33, claim 11, replace "a input" with --an input--;
Column 10, line 7, claim 11, replace "the bandwidth" with --a bandwidth--;
Column 10, line 10, claim 12, replace "The method of claim 10" with --The method of claim 11--;
Column 10, line 11, claim 12, replace "the bandwidth" with --a bandwidth--;
Column, 10, line 13, claim 12, replace "the bandwidth" with --a bandwidth--;
Column 10, line 17, claim 13, replace "The method of claim 10" with --The method of claim 11--;
Column 10, line 20, claim 14, replace "The method of claim 12" with --The method of claim 13--;
Column 10, line 23, claim 15, replace "The method of claim 10" with --The method of claim 11--;
Column 10, line 27, claim 16, replace "the signal bandwidth" with --a signal bandwidth--;
Column 10, lines 47-48, claim 16, replace "the first inductive winding corresponding and the first bond pad" with --the first inductive winding and the first bond pad--; and
Column 10, lines 50-51, claim 16, replace "the second terminating resistor" with --the second terminating impedance--.

Signed and Sealed this
Sixteenth Day of October, 2012

David J. Kappos
*Director of the United States Patent and Trademark Office*